(12) United States Patent
Ryu et al.

(10) Patent No.: US 10,978,587 B2
(45) Date of Patent: Apr. 13, 2021

(54) SEMICONDUCTOR DEVICE

(71) Applicant: KEY FOUNDRY CO., LTD., Cheongju-si (KR)

(72) Inventors: Yu Shin Ryu, Daejeon-si (KR); Tae Hoon Lee, Sejong-si (KR); Bo Seok Oh, Cheongju-si (KR)

(73) Assignee: KEY FOUNDRY CO., LTD., Cheongju-si (KR)

( * ) Notice: Subject to any disclaimer, the term of this patent is extended or adjusted under 35 U.S.C. 154(b) by 0 days.

(21) Appl. No.: 16/564,009

(22) Filed: Sep. 9, 2019

(65) Prior Publication Data

US 2020/0020801 A1 Jan. 16, 2020

Related U.S. Application Data

(60) Continuation of application No. 15/606,360, filed on May 26, 2017, now Pat. No. 10,468,522, which is a
(Continued)

(30) Foreign Application Priority Data

Dec. 23, 2014 (KR) ......................... 10-2014-0187468

(51) Int. Cl.
*H01L 29/78* (2006.01)
*H01L 29/423* (2006.01)
(Continued)

(52) U.S. Cl.
CPC ........ *H01L 29/7816* (2013.01); *H01L 27/092* (2013.01); *H01L 29/0653* (2013.01);
(Continued)

(58) Field of Classification Search
None
See application file for complete search history.

(56) References Cited

U.S. PATENT DOCUMENTS 5,382,535 A 1/1995 Malhi et al.
5,559,045 A 9/1996 Yamamoto
(Continued)

FOREIGN PATENT DOCUMENTS

KR 10-2003-0087739 A 11/2003
WO WO 2014/061254 4/2014

OTHER PUBLICATIONS

Korean Office Action dated Jan. 17, 2020 in Corresponding Korean Patent Application No. 10-2014-0187468, pp. 1-5 (5 pages in Korean).

*Primary Examiner* — Benjamin P Sandvik
(74) *Attorney, Agent, or Firm* — NSIP Law

(57) ABSTRACT

The present examples relate to a semiconductor device used in an electric device or high voltage device. The present examples improve $R_{sp}$ by minimizing drift region resistance by satisfying breakdown voltage by improving the structure of a drift region through which current flows in a semiconductor device to provide optimal results. Moreover, a high frequency application achieves useful results by reducing a gate charge $Q_g$ for an identical device pitch to that of an alternative technology.

20 Claims, 9 Drawing Sheets

Related U.S. Application Data division of application No. 14/802,228, filed on Jul. 17, 2015, now Pat. No. 9,698,258.

(51) Int. Cl.
*H01L 29/06* (2006.01)
*H01L 27/092* (2006.01)
*H01L 29/08* (2006.01)
 H01L 29/66 (2006.01)
 H01L 29/10 (2006.01)
 H01L 21/8238 (2006.01)

(52) U.S. Cl.
CPC .... *H01L 29/0886* (2013.01); *H01L 29/42368* (2013.01); *H01L 29/7835* (2013.01); *H01L 21/823878* (2013.01); *H01L 21/823892* (2013.01); *H01L 29/1083* (2013.01); *H01L 29/665* (2013.01)

(56) References Cited

U.S. PATENT DOCUMENTS

| | | | |
|---|---|---|---|
| 6,117,738 A | 9/2000 | Tung | |
| 6,492,678 B1 | 12/2002 | Hebert | |
| 6,888,205 B2 | 5/2005 | Moscatelli et al. | |
| 7,374,982 B2 | 5/2008 | Hebert | |
| 7,977,715 B2 | 7/2011 | Cal | |
| 8,853,787 B2 * | 10/2014 | Cha | H01L 27/088 257/369 |
| 9,166,039 B2 | 10/2015 | Landgraf et al. | |
| 2004/0084744 A1 | 5/2004 | Khemka et al. | |
| 2004/0238913 A1 | 12/2004 | Kwon et al. | |
| 2006/0097292 A1 | 5/2006 | Nakamura et al. | |
| 2006/0261408 A1 | 11/2006 | Khemka et al. | |
| 2006/0267044 A1 * | 11/2006 | Yang | H01L 29/7816 257/141 |
| 2007/0246771 A1 | 10/2007 | McCormack et al. | |
| 2009/0159970 A1 | 6/2009 | Ichijo et al. | |
| 2010/0181618 A1 | 7/2010 | Meunier-Bellard et al. | |
| 2011/0081760 A1 | 4/2011 | Huang | |
| 2011/0115016 A1 * | 5/2011 | Cha | H01L 29/7391 257/337 |
| 2011/0220995 A1 * | 9/2011 | Chou | H01L 29/66659 257/335 |
| 2011/0260245 A1 * | 10/2011 | Liu | H01L 21/76289 257/337 |
| 2012/0126324 A1 | 5/2012 | Takeda et al. | |
| 2012/0261750 A1 | 10/2012 | Yamashina et al. | |
| 2012/0280319 A1 | 11/2012 | Roehrer | |
| 2013/0134511 A1 * | 5/2013 | Yang | H01L 21/761 257/339 |
| 2013/0140632 A1 | 6/2013 | Landgraf et al. | |
| 2013/0237027 A1 | 9/2013 | Oh | |
| 2014/0008724 A1 * | 1/2014 | Chou | H01L 27/088 257/337 |
| 2014/0231911 A1 * | 8/2014 | Kim | H01L 29/401 257/339 |
| 2014/0339636 A1 * | 11/2014 | Hsu | H01L 27/088 257/343 |
| 2014/0346596 A1 | 11/2014 | Ellis-Monaghan et al. | |
| 2015/0102405 A1 | 4/2015 | Ryu et al. | |
| 2015/0295081 A1 | 10/2015 | Matsuda | |
| 2016/0163583 A1 * | 6/2016 | Liu | H01L 29/0692 257/401 |

* cited by examiner

SEMICONDUCTOR DEVICE

CROSS-REFERENCE TO RELATED APPLICATION(S)

This application is a Continuation Application of U.S. application Ser. No. 15/606,360 filed May 26, 2017 which is a Divisional Application of U.S. application Ser. No. 14/802,228 filed Jul. 17, 2015, now U.S. Pat. No. 9,698,258 issued on Jul. 4, 2017 which claims the benefit under 35 USC 119(a) of Korean Patent Application No. 10-2014-0187468 filed on Dec. 23, 2014 in the Korean Intellectual Property Office, the entire disclosure of which is incorporated herein by reference for all purposes.

BACKGROUND

1. Field

The following description relates to a semiconductor device. The following description also a semiconductor device used in an electric device or a high voltage device.

2. Description of Related Art

In understanding the functionality of an electric device or a high voltage device, there are two important features, which are a breakdown voltage blocking current flow in an off state and resistance that pertains when current flows at a switched-on state. These two features show appropriate trends because of use in a relevant silicon material. In other words, when breakdown voltage is high in a high voltage electric device, a drift region is low doped so $R_{sp}$, which is Specific on-resistance, resistance generally becomes high. By contrast, when the drift region is heavily doped, resistance becomes low and a corresponding breakdown voltage is also greatly lowered.

Moreover, Reduced Surface Field, hereinafter referred to as 'RESURF', technology is to be used on a drift region to obtain high breakdown voltage. A depletion region is extended to an entire n-type epitaxial layer by growing a thick n-type epitaxial layer on a p-type substrate. Accordingly, a strength of an electric field vertically applied on a substrate is greatly reduced. As a strength of an electric field is reduced, a corresponding breakdown voltage is greatly increased by overcoming limitations of a depletion region that is restricted to an original side distance. An accumulation region is formed on a drift region positioned below a gate insulator layer and there is a problem that arises when the length of the accumulation region extends a gate charge $Q_g$ value between regions of a gate and a drain or a gate and a source or a gate and a corresponding bulk increases. As a result, then there is a problem that a Figure of Merit, hereinafter referred to as 'FOM', $R_{on} \times Q_g$, which is considered important in characterizing the performance of a high voltage device or electric device greatly increases.

Therefore it is advantageous to optimize resistance of a drift region through which current flows to reduce conduction loss.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Examples overcome the above disadvantages and other disadvantages not described above. Also, the present examples are not required to overcome the disadvantages described above, and an example is not required to overcome any of the problems described above.

Thus, an object of the examples is to provide a high voltage or an electric semiconductor device with low $R_{on}$ and $R_{sp}$ to reduce power loss, as discussed further above.

Another object of the present examples provides a high voltage semiconductor or an electric device with a low gate charge $Q_g$.

Another object of the present examples provides a high voltage or an electric semiconductor device with a reduced FOM value.

In one general aspect, a semiconductor device includes a deep well region located on a semiconductor substrate, a second conductivity type drift region and a first conductivity type body region in contact with each other and located on the deep well region, a second conductivity type drain region located on the drift region, a second conductivity type source region located on the body region, a gate insulating layer arranged near a first gate insulating layer arranged near the source region and the drain region, and including a second gate insulating layer that is thicker than the first gate insulating layer, and a gate electrode located on the gate insulating layer, wherein the drift region extends from the drain region towards a direction of the source region and towards a part of the region of the first gate insulating layer.

An edge portion of the second gate insulating layer may have a curved slope.

The semiconductor device may further include a first conductivity type buried layer located in the deep well region and located near a bottom side of the drift region.

The semiconductor device may further include a trench type insulating layer located below the second gate insulating layer.

The semiconductor device may further include a second conductivity type buried layer located below the deep well region.

In another general aspect, a semiconductor device includes a first conductivity type semiconductor substrate, a second conductivity type drift region located on the substrate, a first conductivity type first body region and second body region, respectively located on each side of the drift region, a second conductivity type source region located on the first body region and the second body region, a second conductivity type drain region formed on the drift region, a thin first gate insulating layer and a third gate insulating layer, located near the source region, a second gate insulating layer and a fourth gate insulating layer that are thicker than the first gate insulating layer and a third gate insulating layer, located near the drain region, a first gate electrode located on the first and third gate insulating layer, and a second gate electrode located on the second and fourth gate insulating layer, wherein the drift region extends from the drain region towards a direction of the source region and towards a part of the region of the first gate insulating layer.

The second gate insulating layer and the fourth gate insulating layer may be located on the drift region.

The first gate insulating layer may be formed to extend onto the first body region and drift region.

The second gate insulating layer may be formed to extend onto the second body region and the drift region.

The semiconductor device may further include a second conductivity type buried layer located on the semiconductor substrate, and a first type deep well region located on the buried layer.

In another general aspect, semiconductor device includes a drift region and a body region in contact with each other and located on a deep well region located on a semiconductor substrate, a drain region located on the drift region, a source region located on the body region, a gate insulating layer arranged near a first gate insulating layer arranged near the source region and the drain region, and including a second gate insulating layer that is thicker than the first gate insulating layer, and a gate electrode located on the gate insulating layer, wherein the drift region extends from the drain region towards a direction of the source region and towards a part of the region of the first gate insulating layer.

The body region may be of a first conductivity type and the drift region, the drain region, and the source region may be of a second conductivity type.

An edge portion of the second gate insulating layer may have a curved slope.

The semiconductor device may further include a first conductivity type buried layer located in the deep well region and located near a bottom side of the drift region.

The semiconductor device may further include a trench type insulating layer located below the second gate insulating layer.

The semiconductor device may further include a second conductivity type buried layer located below the deep well region.

A high voltage semiconductor device of the examples discussed as above has the following effects.

The present examples improve $R_{sp}$ by minimizing the resistance of a drift region and increasing a breakdown voltage by changing a Laterally Diffused MOSFET (LDMOS) region into a stepped oxide layer form from a separated region STI made of a thin trench to form an n-type MOS or p-type MOS of $R_{sp}$ with low resistance in a drift region.

In examples, the structure is changed from a separation region STI including a thin trench into a stepped oxide layer, and by making this change, an accumulation region length is reduced to a level of approximately 50% in comparison to a structure of a conventional STI region including thin trenches and thus, gate charge $Q_g$ is reduced to 60% in an otherwise identical device, providing advantages that are applicable to high frequency applications.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
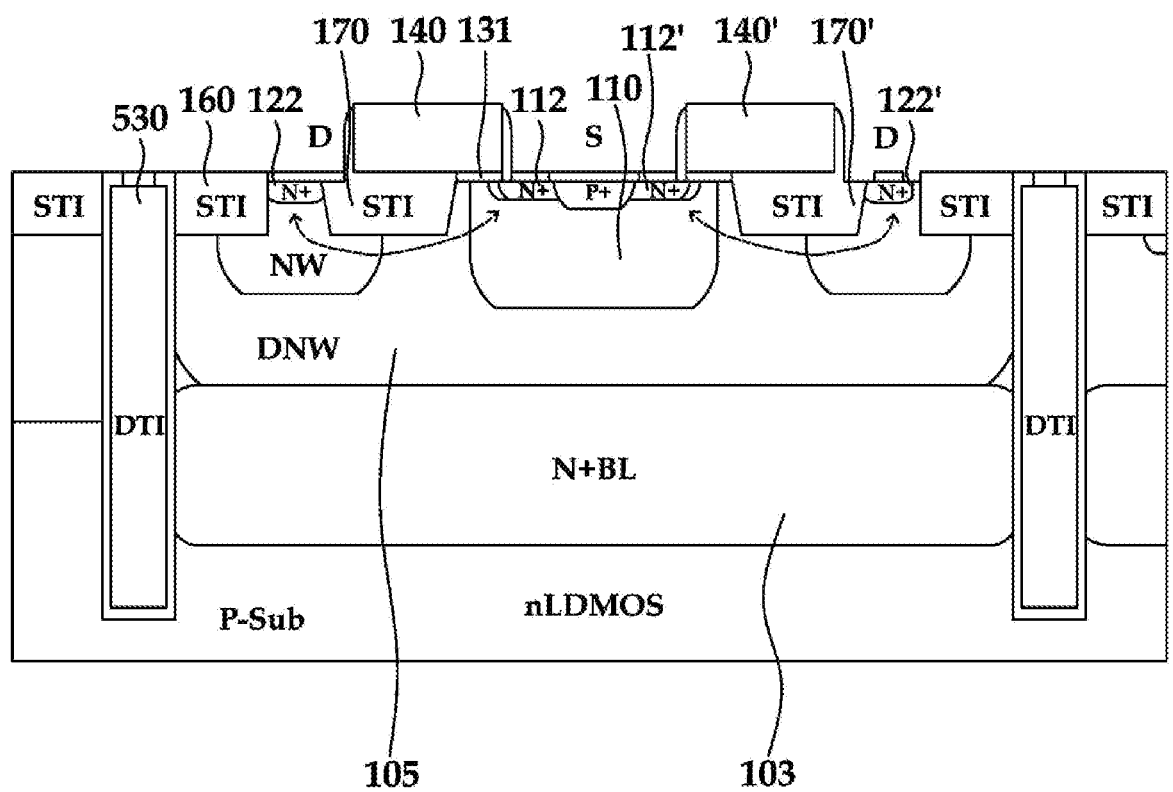
FIG. 1 is a cross-sectional diagram illustrating an LDMOS semiconductor device according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Certain examples are now described further with reference to the accompanying drawings.

In the following description, the same drawing reference numerals are used for the same elements even in different drawings. The matters defined in the description, such as detailed construction and elements, are provided to assist in a comprehensive understanding of the present examples. Accordingly, it is apparent that the examples are able to be carried out without those specifically defined elements. Also, well-known functions or constructions are not described in detail since they would otherwise obscure the invention with unnecessary detail.

While the expressions such as "first" or "second" are used to refer to various elements, the elements are not intended to be limited by the expressions. These expressions are used only for the purpose of distinguishing one element from the other.

The expressions are used herein only for the purpose of explaining specific examples and not to limit the present examples. An expression in singular form is intended to encompass plural meanings as well, unless otherwise specified. Throughout the description, the expression "comprise" or "have" is used only to designate the existence of a characteristic, number, step, operation, element, component or a combination thereof which are described herein, but not to preclude possibility of existence of one or more of the other characteristics, numbers, steps, operations, elements, components or combinations of these as an addition.

The present examples relate to a Lateral Double-diffused Metal-Oxide-Semiconductor (LDMOS) or Extended Drain Metal-Oxide-Semiconductor (EDMOS). An LDMOS is a representative horizontal type electric device that acts as a multiple carrier device with a fast switching response and high input impedance. Moreover, an EDMOS is a Metal-Oxide-Semiconductor (MOS) device designed to be suitable for a portable power management device or a high voltage applied portion of an electronic device, such as PC periphery portion. For example, the EDMOS device is potentially formed by applying an exposure process with an identical channel length as a Complementary MOS (CMOS), unlike an original LDMOS. Further, an EDMOS device potentially includes a Power Integrated Circuit (PIC) by integrating an electric device and a logic device in one chip compared to other electric devices.

Hereinafter, examples are explained in detail with reference to an attached diagram.

FIG. 1 is a cross-sectional diagram of a LDMOS device using a STI structure, according to an example.

The LDMOS includes layer isolation regions 170 and 170', with a trench being formed between drain regions 122, 122' and gate electrodes 140, 140' as illustrated in FIG. 1. Moreover, a P-body region 110 is included to form a channel region. Further, source regions 112, 112' are positioned between two gate electrodes 140, 140'.

There is a RESURF effect, as discussed above, because of a trench region formed deep between a drain region and a source region. Thus, a high electric field applied on the drain region further decreases in a source region direction. Hence, a high breakdown voltage $BV_{dss}$ of over 20 V is maintained. However, electric current flow, represented by a dotted arrow, between drain regions 122, 122' and source regions 112, 112' is curved. Thus, there is a problem of a current route, represented by the dotted arrow, lengthening. Moreover, resistance of an N type drift region (DNW) 105 is high, thus, $R_{sp}$ value increases significantly accordingly. For example, a resistance of the N type drift region potentially has a value over 20 mohm-mm$^2$.

Hereinafter, an LDMOS and an EDMOS structure applied with a stepped gate insulator layer instead of STI insulator layer 170 is discussed.

Figure 2:
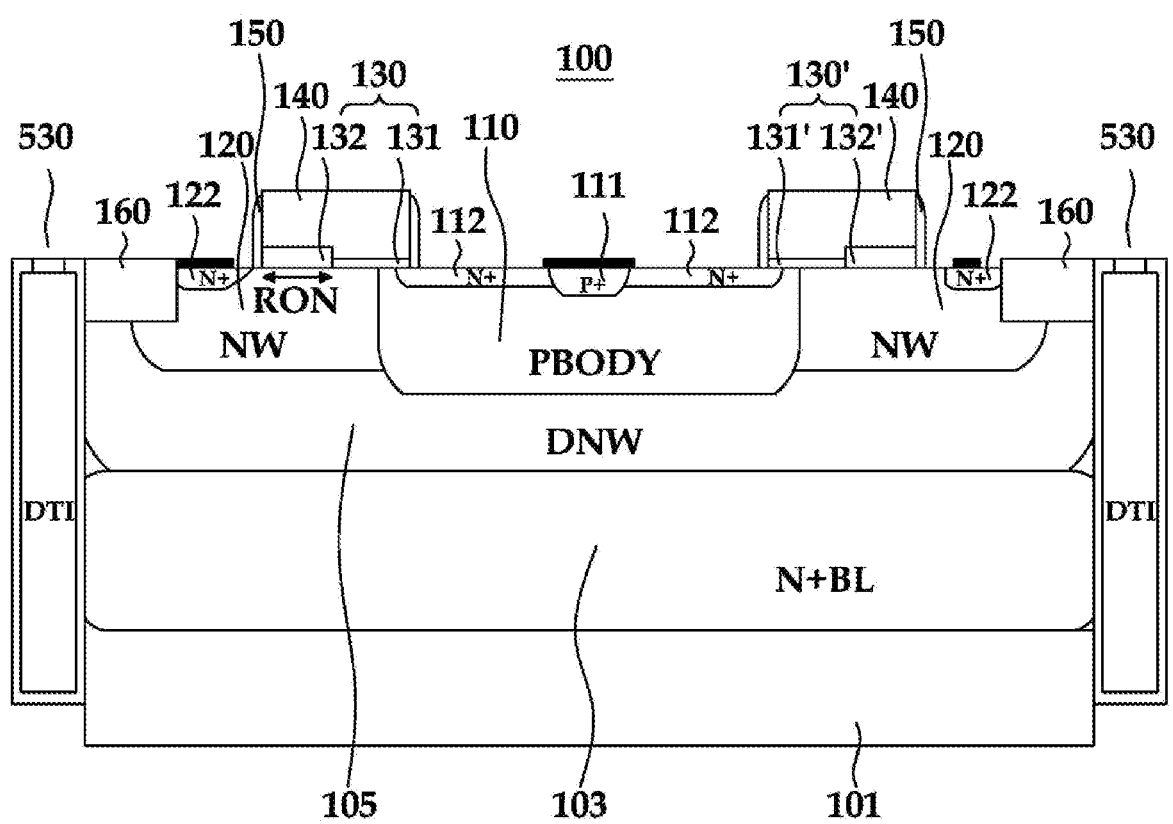
FIG. 2 is another cross sectional diagram illustrating an LDMOS semiconductor device according to another example.

In FIG. 2, when a RON region of LDMOS, that provides specific ON-resistance at a turn-on state, is changed to stepped oxide layers 130, 130' instead of STI insulating layer at 170 of FIG. 1, there is an effect of a current route, shown by an arrow sign, further shortening. In other words, since thick gate insulating layer 132 is replaced on a substrate instead of a deep trench region 170, an insulating layer of a trench shape does not exist on a drift region surface that is immediately under a gate electrode 140. Thereby, there is an effect of improving $R_{on,sp}$ (specific ON-resistance at a turn-on state) while satisfying BV. An $R_{on}$ value is potentially under 20 mohm-mm^2 such as 10 mohm-mm^2 in some circumstance. Moreover, high breakdown voltage ($BV_{dss}$) of over 20V can be maintained because thick second gate insulating layer 132, 132' is formed.

FIG. 2 is a cross-sectional diagram illustrating a LDMOS semiconductor device according to another example. The LDMOS in the example of FIG. 2 is N-type.

A semiconductor substrate 101 is a part of an N-type LDMOS semiconductor device, hereinafter referred to as nLDMOS, 100, as illustrated. A semiconductor substrate 101 is a P-type silicon substrate, hereinafter referred to as P-Sub. Moreover, an N-type buried layer, hereinafter referred to as NBL 103, is a high concentration doping region formed on a semiconductor substrate 101. The NBL 103 is required for providing a fully isolated MOS device in a high voltage device. A fully isolated MOS device is used on a P-type body region, hereinafter referred to as PBODY 110, or N-type drain region 112, acts to apply a small back-bias but, an isolation structure using NBL 103 has an object of noise reduction by using high voltage device switching. Therefore, a gain is minimized in a parasitic BJT structure comprised of PBODY 110/NBL 103/P-Sub 101, according to examples. Hence, such a high concentration NBL is used to reduce leakage. When many high voltage devices process high switching, a little leakage potentially easily appears as power consumption or heat generation. Therefore, a low gain under 0.1 dB is a design goal.

Moreover, a low concentration Deep N well, hereinafter referred to as a DNW, region 105 that is lower than a buried layer is formed on an NBL 103. Such a DNW region 105 herein is used when the DMOS device is to be separated from other devices. When other DMOS devices formed with PW are arranged next to the DMOS device, separation is not required, so in this case a DNW region does not need to be formed.

The N-type well region 120 (NW) and P-body region 110 (PBODY) are formed on a DNW region 105. A PBODY region includes a P+ contact region 111 and N+ source regions 112. Moreover, an NW region 120 is formed on a left and a right side of a PBODY region 110 and the DNW region 105 and concentration in the NW is formed to be higher than the concentration of the DNW region 105. Also, a high concentration N+ drain region 122 is formed on the NW region 120.

Gate insulator layers 130, 130' are formed on the PBODY region 110 and the NW region 120. The gate insulator layers 130, 130' are symmetrically formed with reference to a P+ contact region 111 of a PBODY region 110, according to a diagram.

Here, gate insulator layers 130, 130' are further explained. However, because the gate insulator layers 130, 130' are formed in an identical structure, only one gate insulator layer 130 is explained and gate insulator layer 130' includes similar features.

A gate insulating layer 130 includes a first gate insulator and a second gate insulating layer 132. A second gate insulating layer 132 uses a thicker layer than a corresponding first gate insulating layer 131. With reference to the diagram, an N+ source region 112 near portion is thinner and a high concentration N+ drain region 122 near portion is formed thicker. In other words, a thin gate insulating layer 131 is arranged near a source region 112 and a thick gate insulating layer 132 is arranged near the drain region 122. This is because drain voltage is higher than a source voltage, so thickness increases as it goes near the drain region from the source region. If thickness goes in the opposite way, the gate insulating layer is potentially destroyed due to a high drain voltage. Although the gate insulating layer optionally includes only first gate insulating layer 131 with a relatively lower thickness to increase drain current, there is also optionally a second gate insulating layer 132 that is made to be thicker because a high voltage is applied onto the high concentration N+ drain region 122. Additionally, the thickness of a second gate insulating layer 132 uses thickness appropriate to a medium voltage or a high voltage device.

According to an example, a part of the gate insulating layer 130 is in contact with a PBODY region 110 and a remaining part is formed to be in contact with an NW region 120. In particular, the gate insulating layer 131 is located on a boundary where the PBODY region 110 and the NW region 120 are in contact. However, the second gate insulating layer 132 is only in contact with an NW region 120. The second gate insulating layer 132 is not exposed, except for the NW region 120. Moreover, a high concentration N+ drain region 122 is formed to be separated by a certain distance with a spacer 150 of a gate electrode 140. Such a formation is chosen to increase a breakdown voltage.

A gate electrode 140 is formed on the gate insulating layer 130. For example, such a gate electrode 140 is formed to correspond to a thickness of the gate insulating layer 131 and the second gate insulating layer 132.

A spacer 150 of an insulating layer material is formed on left/right side of a gate insulating layer 130 and a gate electrode 140, so as to separate these elements from other portions of the device.

A separation region (STI) 160 comprised of a thin trench for separation from an adjacent device is formed next to the high concentration N+ drain region 122. A Local Oxidation of Silicon (LOCOS) oxide layer is optionally used instead of STI. Moreover, a high voltage or an electric device is optionally additionally formed with medium trench isolation (MTI) and deep trench isolation (DTI) 530 next to STI 160 for device separation.

Salicide is formed on part of a source region 112, a drain region 122 and a gate electrode 140. Here, salicide refers to a technology used to form electrical contacts between a semiconductor device and the supporting interconnect structure. The salicide process includes the reaction of a thin metal film with silicon in the active regions of the device to form a metal cilicide contact through annealings and/or etching processes. Salicide approaches are used to lower the resistance between respective contact plugs and a substrate. Therefore, the salicide is formed on a region in which the contact plug is potentially formed and a remaining region is not formed on a substrate after a non-salicide process.

Figure 3:
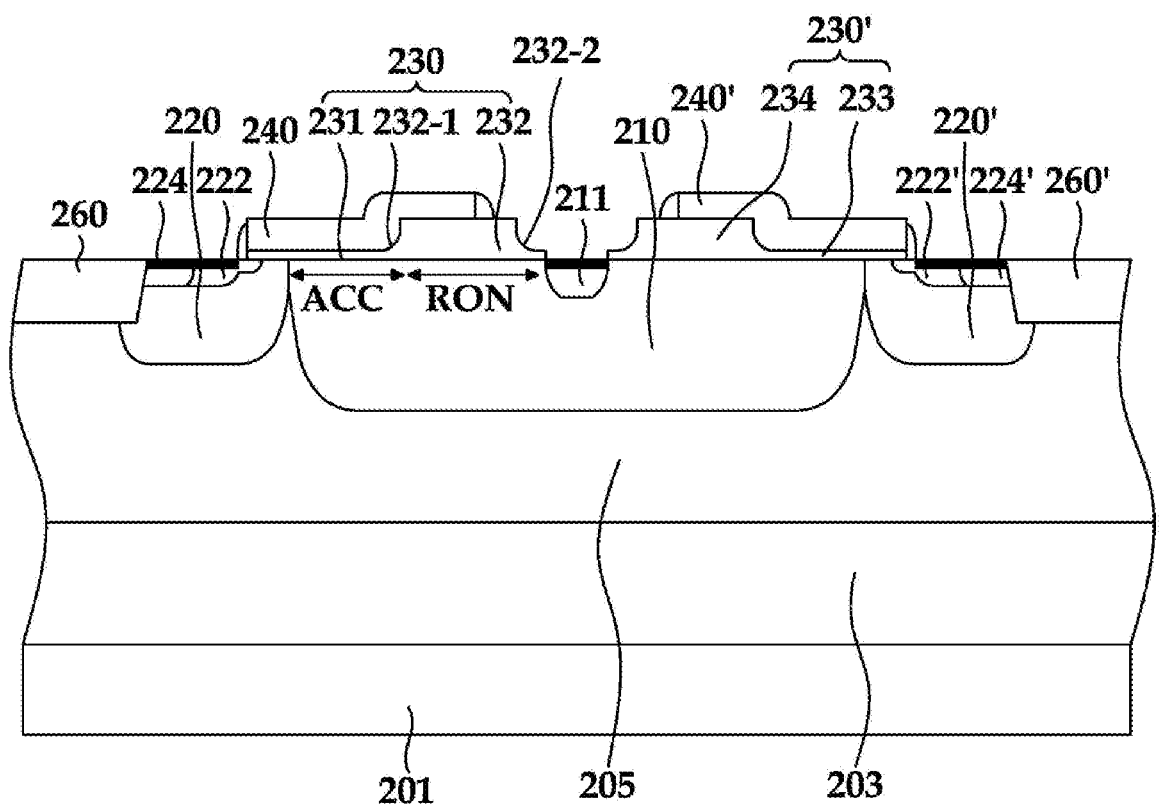
FIG. 3 is a cross-sectional diagram illustrating an LDMOS semiconductor device according to another example.

FIG. 3 is a diagram illustrating an LMOS semiconductor device according to another example. In the example of FIG. 3, the positions of a source and a drain region are changed comparing with the example of FIG. 2.

In other words, an N type buried layer 203 is formed on a P type semiconductor substrate 201 and a deep P well 205, hereinafter referred to as DPW 205, is formed on a buried layer 203. Moreover, a shallow trench isolation region 260, 260' is formed on the DPW region 205. Also, an n-type drift, hereinafter referred to as N-DRIFT, region 210 is formed. Likewise, a P type body, hereinafter referred to as P-BODY, region or P type well region, hereinafter referred to as PW, 220, 220' is formed on the right and left sides of the N-DRIFT region 210. An N+ drain region 211 is formed on the N-DRIFT region 210 and N+ source regions 222, 222' are each formed on two P-BODY regions 220, 220'.

Gate insulating layers 231, 232 of different thickness are formed on the N-DRIFT region 210 and the P-BODY region 220, 220'. The gate insulating layers 231, 232 are formed symmetrically with reference to an N+ drain region 211 of the N-DRIFT 210 as illustrated in FIG. 3. The thickness of the first gate insulating layer 231 is formed to be thinner near N+ source region 222 and the thickness of a second gate insulating layer 232 is formed to be thicker near an N+ drain region 211.

In particular the first PBODY region 220 and the N-DRIFT region 210 are formed under the thin first gate insulating layer 231. However, the thick second gate insulating layer 232 is in contact with the N-DRIFT region 210 and the N+ drain region 211. The second gate insulating layer 232 is not exposed except to the N-DRIFT region 210 and the N+ drain region 211.

A third gate insulating layer 233 and a fourth gate insulating layer 234 are the same as the first gate insulating layer 231 and the second gate insulating layer 232 to which they correspond. The second PBODY region 220' and the N-DRIFT region 210 are formed under the thin third gate insulating layer 233. However, the thick fourth gate insulating layer 234 is in contact with an N-DRIFT region 210 and an N+ drain region 211. The fourth gate insulating layer 234 is not exposed except to the N-DRIFT region 210 and the N+ drain region 211.

In other words, the thin first gate insulating layer 231 and the third gate insulating layer 233 exist near source regions 222, 222'. Additionally, the second gate insulating layer 232 and the fourth gate insulating layer 234 that are thicker than the corresponding first gate insulating layer 231 and the third gate insulating layer 233 are positioned near the drain region 211. Thus, the first gate insulating layer 231 is formed extending on a first body region 220 and a drift region 210 and a third gate insulating layer 233 is formed to extend over the second body region 220' and the drift region 210. Moreover, the second gate insulating layer 232 and the fourth gate insulating layer 234 are formed upon a drift region 210 and an N+ drain region 211. Additionally, a drift region 210 is formed to extending onto a part of the first and the third gate insulating layers 231, 233 in a direction from a drain region 211 to source regions 222, 222'.

In examples, the thickness of both edge portions 232-1, 232-2 of a second gate insulating layer 232 does not decrease rapidly, but instead the thicknesses are formed to gradually decrease. For example, the thickness of the edge portion decreases in a curved shape. Thus, an overall shape of the second gate insulating layer 232 has a trapezoidal shape which is the same as both sides of the corresponding edge portion of the fourth gate insulating layer 234. The edge portion is made to have a gradual slope in order to deposit poly-Si and to avoid leaving Poly-Si residue in an etching process. For example, Poly-Si residue potentially exists in the edge portions 232-1, 232-2 after patterning when one of the edge portions 232-1, 232-2 of the gate insulating layers 232, 234 has a rapid slope when Poly-Si is deposited on one of the thick gate insulating layers 232, 234 and during process patterning to form gate electrodes 240, 240'. As a result, a short circuit is generated between a gate electrode and a gate insulating layer, potentially damaging the semiconductor device.

For handling this issue, the second gate insulating layer 232 and the fourth gate insulating layer 234 are deposited and formed by an etching process in a careful manner. For example, it is preferable to conduct the etching process in two processes, more specifically dry etching and wet etching. A deposited gate insulating layer is partly removed with dry etching and the remaining thickness is removed with wet etching. An edge profile is a straight line because dry etching is anisotropic etching, also known as orientation dependent etching, whereas wet etching is isotropic etching so the edge profile is a curve, because in isotropic etching the etchant erodes the substrate equally in all directions. Moreover, when only wet etching is used, width control of a gate insulating layer is difficult. Also, too much etching solution can be put between photo resist and a gate insulating layer so edge curve can be gradual more than necessary. In this case, breakdown of a gate insulating layer 232, 234 can occur.

Additionally, the first gate electrode 240 is formed on the first gate insulating layer 231 and the second gate insulating layer 232 and the second gate electrode 240' are formed on the third gate insulating layer 233 and the fourth gate insulating layer 234, respectively. Moreover, the N+ drain region 211 is positioned directly next to the second gate insulating layer 232 and the fourth gate insulating layer 234. A spacer that is composed of an insulating layer material is formed on left and right sides of a gate insulating layer 230 and the first gate electrode 240. In this example, the spacer is formed on sides of a thick second gate insulating layer 232, in other words, on an edge portion 232-2. This positioning is chosen because the second gate insulating layer 232 has a thickness of over 100 nm and only the edge portion is exposed. Hence, when the spacer is formed in this manner, the sides of the second gate insulating layer 232 are protected more stably from the etching process subsequently. Moreover, an isolation region 260 including a trench is formed next to the high concentration N+ source region 222 for separation from an adjacent device.

Referring to FIG. 3, there is an effect wherein current route is further shortening as a RON region, indicated by an arrow sign, of a LDMOS is changed into a stepped oxide layer shape instead of a STI insulating layer, as shown at 170 of FIG. 1. In other words, in the example of FIG. 3, a trench shape insulating layer is not formed directly below drift region surface since the thick gate insulating layers 232, 234 are formed on a substrate instead of on a deep trench region 170. Thereby, resistance increase due to a drift region 210 is minimized because of the shortened electrical route. Thus, there is an effect of satisfying a breakdown voltage $BV_{dss}$ of over 20 V while also improving $R_{ON, SP}$ corresponding to specific ON-resistance at a turn-on state of under 20 mohm-mm^2.

Additionally, an accumulation region length, shown in FIG. 3 as being an ACC region, indicated by an arrow sign, according to a change to stepped gate insulating structures 230, 230' is reduced to a level of approximately 50% against an STI structure. Here, a depletion region is formed between a drift region 210 and a bulk region DPW 205 when a semiconductor device is normally operating. This depletion layer impedes current flow. Referring to the example of FIG. 3, an insulating layer of a trench structure that is similar to an STI structure overlapped with a gate electrode of FIG. 1, instead of a thick gate insulating layer on a substrate, is formed on a substrate. Hence, a place a current can flow becomes smaller. This result is because in a LDMOS semiconductor device, a depletion region gradually expands in a STI structure from a drift region thereby, and hence current flow is impeded because an accumulation region of a drift region is narrow due to STI structure being below gate electrode 240. In order to prevent this issue, an accumulation region ACC is to be obtained in a LDMOS device with a STI structure overlapped with a gate electrode 240. Then, normal operation is possible, but Ron resistance still increases due to the presence of a lengthened drift region.

On the other hand, in a stepped oxide structure, a space current that is able to flow towards substrate surface is obtainable although a depletion layer is expanded. This effect is achieved because of the absence of an STI structure that overlaps with a gate electrode. Thus, length of an accumulation region compared with an STI structure is potentially smaller by over 50%. Thereby, a reduction effect of Ron resistance of drift region and a pitch size reduction of unit device are achieved. Consequently, a gate electrode $Q_g$ is reduced to ~60% from an identical device pitch. Thus, a gate electrode has a value under 10 nC and $R_{on}$ has a value under 10 mohm-nC. An figure of merit (FOM) value that characterizes efficacy potentially goes even below 60 mohm-nC. Herein, a gate electrode $Q_g$ is formed in proportion to accumulation region length.

A gate charge includes both capacitance values between a gate region and a drain region or a source region and between a gate region and a bulk region. It is important to reduce a gate capacitance value between the gate region and the drain region. When a structure suggested by the examples is used, a capacitance between the gate region and the drain region is substantially reduced. The purpose of using a LDMOS device with a low gate charge is to reduce power loss. For example, consumption loss due to $Q_g$ rapidly increases at over approximately 500 kHz. However, rapid increase of power loss is potentially prevented by arranging thick second gate insulating layer, instead of an STI structure, to overlap with a gate electrode.

An LDMOS device with such a low charge is applicable for a high frequency application. For example, the LDMOS device is potentially used on a gate drive IC used on a mobile MIC DC-DC converter or a motor drive type gate drive IC. Moreover, a semiconductor device with a stepped gate insulating layer is also potentially used on a RF device or switching power MOSFET device.

Referring to the examples of FIGS. 4 to 8, these examples relate to an EDMOS semiconductor device of another, related structure. In other words, the present examples are not only applicable to the aforementioned LDMOS semiconductor device, but also to an EDMOS semiconductor device.

Figure 4:
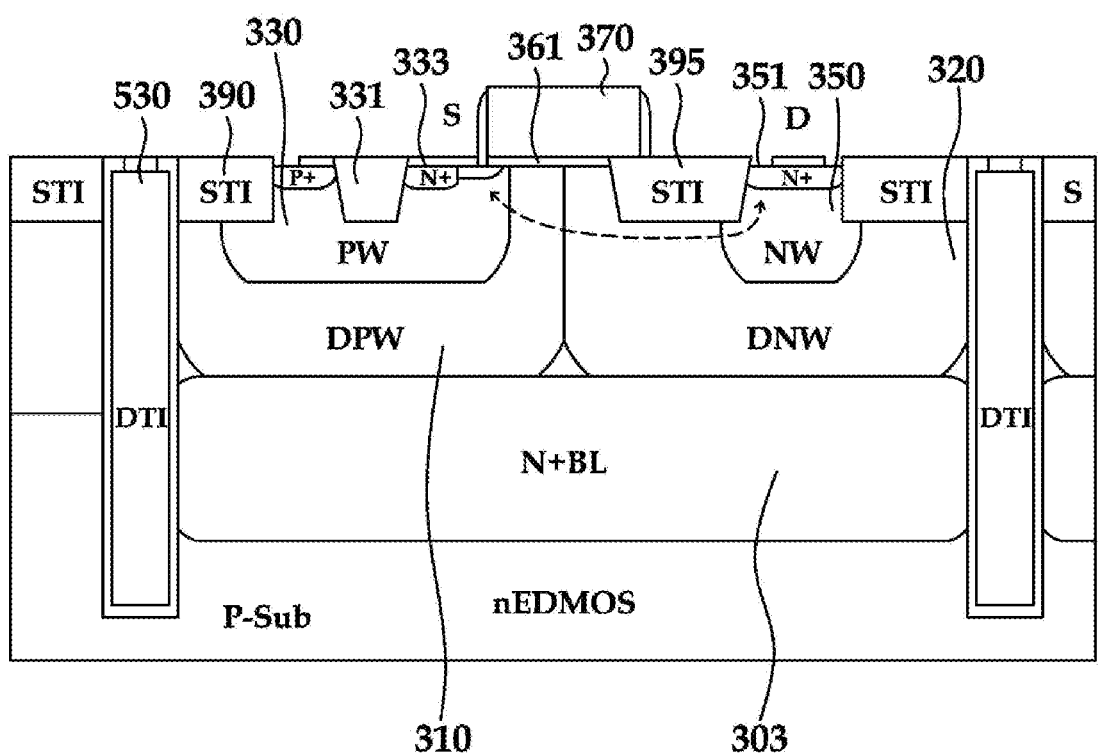
FIG. 4 is a cross-sectional diagram illustrating an EDMOS semiconductor device according to an example.

FIG. 4 is a cross-section of an EDMOS device like FIG. 1.

Referring to FIG. 4, a trench region 395 using STI is formed on a gate electrode 370 and a drain region 351 as in FIG. 1. The current route, shown as a dotted arrow, is curved between a drain region 351 and a source region 333. Therefore, there is a problem of the current route, illustrated by the dotted arrow, lengthening. Moreover, since the resistance of N type drift region (DNW) 320 is high, $R_{sp}$ value increases accordingly. Hence, a similar issue of the aforementioned $R_{on}$ resistance increasing, and so on, results.

Figure 5:
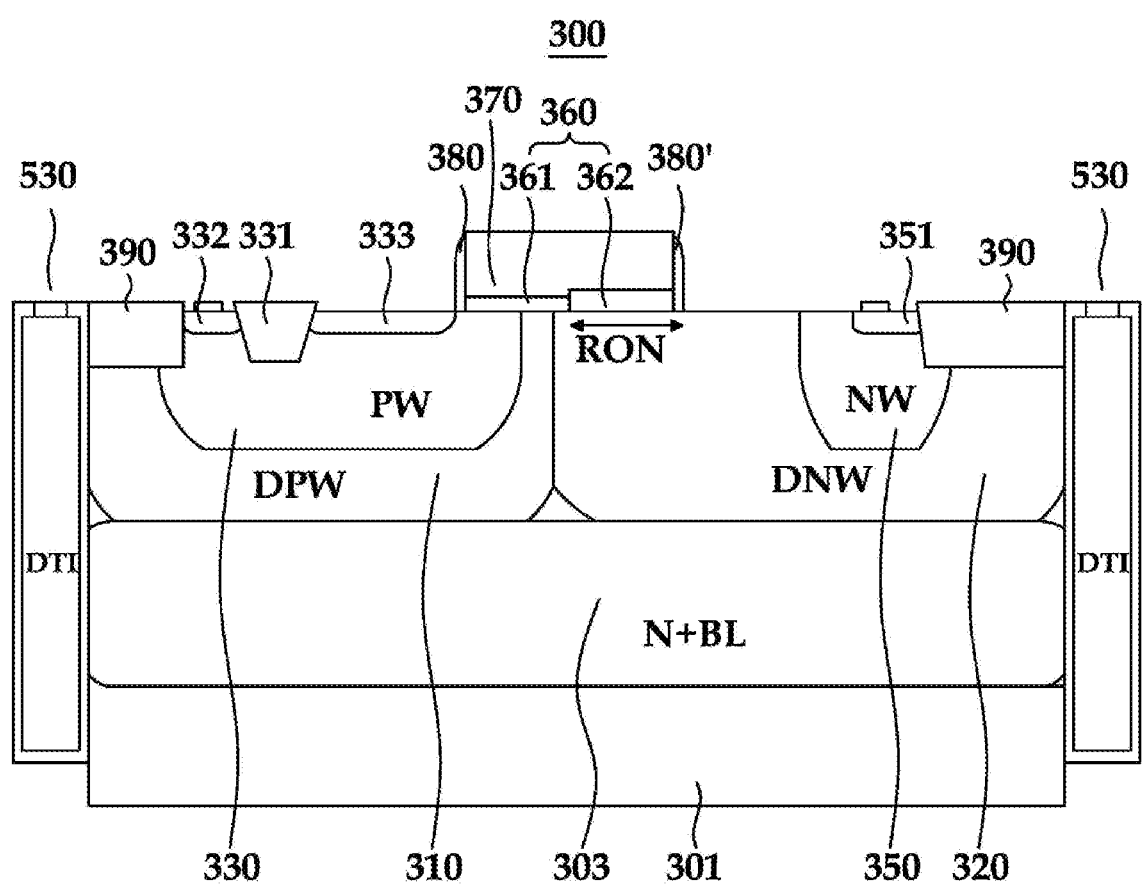
FIG. 5 is a cross-sectional diagram illustrating an EDMOS semiconductor device according to another example.

FIG. 5 is a cross-sectional diagram illustrating an n-type EDMOS, hereinafter referred to as nEDMOS, semiconductor device according to another example.

Referring to the example of FIG. 5, a semiconductor substrate 301 which is a p type silicon substrate is formed. A high concentration doping region which is an n type buried layer, hereinafter referred to as NBL 303, is formed on a semiconductor substrate 301.

Two well regions 310, 320 are formed on the NBL 303. The two well regions are a P type deep well, hereinafter referred to as DPW region 310 and an N type deep well, hereinafter referred to as DNW region 320. Among respective regions 310 and 320, one side of a region on a semiconductor substrate 301 is optionally bigger or smaller than the other. Moreover, a P type well region, hereinafter referred to as PW 330, is formed on a DPW region 310. A trench isolation region 331 is formed between an N+ source region 333 and a P+ contact region 332 in a PW region 330.

Additionally, an N type well, hereinafter referred to as NW region 350, is formed on a DNW region 320. Herein, a concentration of the DNW region 320 is lower than a concentration of the NW region 350. Further, a high concentration N+ drain region 351 is formed on an NW region 350. Also, a high concentration N+ drain region 351 is formed separated at a certain distance from a spacer of an electrode 370 to increase breakdown voltage. In this example, the NW region 350 and the DNW 320 region are formed near a drain region wherein an N+ drain region 351 is highest. Since a concentration of a DNW region 320 is lower than a concentration of NW region 350, there is a characteristic result in which electric fields are weakened in both horizontal and vertical directions. Thus, this example is characterized by a very high breakdown voltage. Moreover, a size and a width of an NW region 350 formed on a PW region 330 and a DNW region 320 that is formed on a DPW region 310 are different. For example, a width of the PW region 330 is greater than a width of the NW region 350. This difference of width is used to increase breakdown voltage by making the DNW region 320 portion with a lower concentration than a concentration of the NW region 350 bigger than the NW region 350.

A gate insulating layer 360 with a differing thickness is formed on a DPW region 310 and a DNW region 320. A gate insulating layer 360 includes a first gate insulating layer 361 and a second gate insulating layer 362. A thickness of a first gate insulating layer 361 is formed to be thinner than a second gate insulating layer 362 arranged near a drain region 351. In other words, since a drain voltage is higher than a source voltage, the thickness of a gate insulating layer is formed to be thicker near the drain region than the source region.

Also, the first gate insulating layer 361 is in contact with the PW region 330 and the DPW region 310. Moreover, the first gate insulating layer 361 is in contact with part of the DNW 320. Being in contact, in one example, means overlapping. The DNW region 320 is formed to further extend towards a source region 333 direction at a boundary side of the first gate insulating layer 361 and the second gate insulating layer 362. Thus, in such an example, a second gate insulating layer 362 thicker than a first gate insulating layer 361 is completely surrounded.

In examples, the second gate insulating layer 362 is not in contact with a DPW region 310 or a PW region 330. Thereby, only the first gate insulating layer 361 is to be exposed in a channel region. Herein, the channel region indicates a PW region 330, a DPW region 310 positioned between a DNW region 320 and a source region 333, and a substrate region overlapping with a first gate insulating layer 361 among the PW region 330 and the DPW region 310. Thus, a drain current is able to greatly increase because a first gate insulating layer 361, with a smaller thickness, is formed in a channel region.

Additionally, the PW region 330 becomes a threshold voltage $V_t$ control region because a concentration of the DPW region 310 is lower than a concentration of the PW region 330 in a channel region. Also, since the DPW region 310 and the PW region 330 have different concentrations, different threshold voltages $V_t$ potentially exist. For example, DPW region is a region with lower threshold voltage $V_t$ than PW region. Therefore, the PW region 330 easily controls an off-current and the DPW region 310 easily controls an on-current, so concentration and width control of these regions is necessary. To reduce off-current in this example, it is preferable to have a width of a PW region 330 overlap with a gate electrode that wider than the DPW region 310. Moreover, an ON-current is controllable with DPW width, but an easier method is to control a thickness of a first gate insulating layer 361. For example, on-current value is more influenced by thickness of a first gate insulating layer 361, and hence it is easier to regulate the on-current value in this way.

A gate electrode 370 is formed on a gate insulating layer 360 and spacers of insulating layer material are formed on left and right sides of the gate insulating layer 360 and the gate electrode 370. Herein, the gate electrode 370 overlaps with the PW 330, the DPW 310, and the DNW 320. A high concentration N+ drain region 351 is formed to be separated by a certain distance from the right spacer 380 but, an N+ source region 333 is formed to be in contact with the left side spacer 380.

A separation region, hereinafter referred to as STI 390, including a thin trench, is formed next to the PW region 330 and the NW region 350 for separation from an adjacent device. Alternatively, a Local Oxidation of Silicon (LOCOS) oxide layer is optionally used instead of STI 390. Additionally, in a high voltage device or another electric device, medium trench isolation (MTI) or deep trench isolation (DTI) is deeply formed next to STI 390 for device separation.

Referring to the example of FIG. 5, the example causes an effect of a shorter current route by changing the RON region, shown by an arrow sign, of a LDMOS to a stepped oxide layer 360 shape instead of the STI insulating layer 395 shown in FIG. 4 shape. In other words, an insulating layer of a trench form is not formed below a DNW region 320 which is directly under a gate electrode 370, because a thick gate insulating layer 362 is formed on a substrate instead of a deep trench region 395. Hence, the resistance of a DNW region 320 is minimized due to the shortened current route. Therefore, there is an effect of improving an $R_{sp}$ while providing an acceptable BV.

Figure 6:
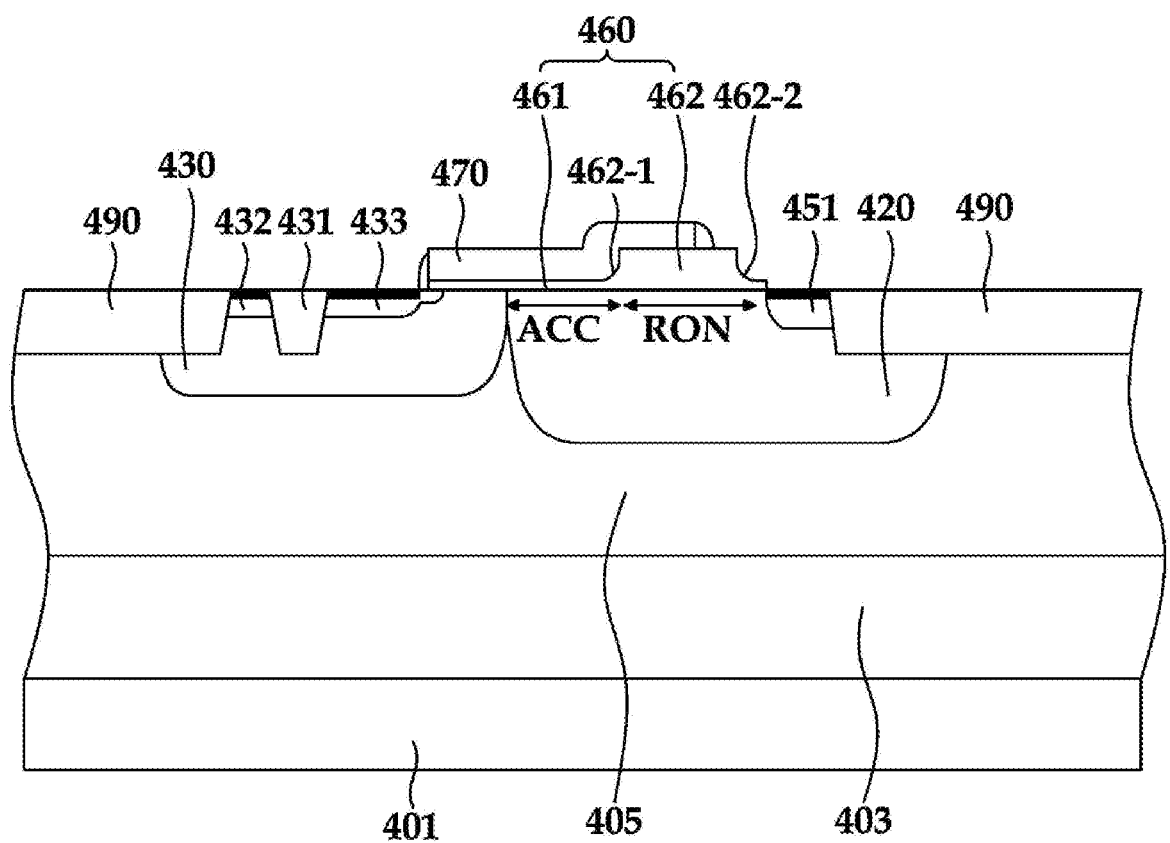
FIG. 6 is a cross-sectional diagram illustrating an EDMOS semiconductor device according to another example.

FIG. 6. is a cross-sectional diagram illustrating an EDMOS semiconductor device according to another example. A difference when comparing FIG. 6 with FIG. 5 is that in the example of FIG. 6, an N-DRIFT region 420 and a P-WELL region or P-BODY 430 are in contact with each other. In such an example, a DPW region 405 is also formed under drain region 451.

In other words, an N type buried layer 403 is formed on a P type semiconductor substrate 401 and a deep P well, hereinafter referred to as DPW, is formed on the buried layer 403. N type drift, hereinafter referred to as N-DRIFT region 420, is formed when an N+ drain region 451 is formed on a DPW region 405. A P type body, hereinafter referred to as P-BODY region 430, is formed next to the N-DRIFT region 420. An N+ source region 433 is formed in the P-BODY region 430. An N-DRIFT region 420 is formed not only under a thick second gate insulating layer, hereinafter referred to as thick Gate Oxide (GOX) 462, but also under a thin first gate insulating layer, hereinafter referred to as thin GOX 461 whereas, only a thin GOX is formed on a P-BODY region. Additionally, an N-DRIFT region 420 not only surrounds a drain region 451 but also is formed to extend into a think trench isolation region 490 below. In other words, STI region 490 potentially reduces a chip size by extending to an N-DRIFT region 420.

Gate insulating layers 461 and 462 with different thickness are formed on an N-DRIFT region 420 and a P-BODY region 430. A first gate insulating layer 461 formed near N+ source region 433 is formed to be thinner and a second gate insulating layer 462 near an N+ drain region 451 is formed to be thicker. As aforementioned in FIG. 4, edge portions 462-1, 462-2 of a second gate insulating layer 462 overlap and therefore the thicknesses of the edge portions 462-1, 462-2 decrease gradually. For example, the thickness of an edge portion decreases in a curved line. Hence, an entire shape of a second gate insulating layer 462 has a trapezoidal shape.

Additionally, a gate electrode 470 is formed on a gate insulating layer including a first gate insulating layer 461 and a second gate insulating layer 462. A spacer of an insulating layer material is formed on the right and left sides of a gate insulating layer 460 and a gate electrode 470. In this example, a spacer is formed on a side of a thick second gate insulating layer 462, in other words an edge portion 462-2. This is because thickness of a second gate insulating layer 462 is thick over 100 nm and one side of an edge portion 462-2 is exposed. When a spacer is formed, a side of a second gate insulating layer is thus stably protected from an etching process conducted hereafter.

Moreover, an isolation region 490 including a trench is formed next to a high concentration N+ source region 433 for separation from an adjacent device. Moreover, a P+ pick up region 432 is formed. An STI region 431 is formed between the N+ source region 433 and the P+ pickup region for separation purposes. When isolated from the STI region 431 and the respective contact plug is formed on a source region 433 and a P+ pick up region 432, there is advantage in which different voltages are potentially applied.

As illustrated in FIG. 6, there is an effect of further shortening a current route as an EDMOS region is changed into a stepped oxide layer shape 460 instead of a STI insulating layer 395 as shown in FIG. 4. In other words, a drift region 420 surface right below a gate electrode 470 namely a region displayed with the label RON is not formed to have a trench shape insulating layer since a thick second gate insulating layer 462 is replaced with a deep trench region 395 on a substrate. Moreover, a region displayed to be an ACC region is reduced more than 50% compared to the original size of such a region, and thus, N-DRIFT region resistance 420 is minimized due to a shortened current route. Thus, $R_{sp}$ is improved while also satisfying BV.

In other words, an accumulation region length displayed as ACC is able to be reduced to approximately 50% compared to an original STI structure because STI, illustrated at 395 of FIG. 4, is changed to a stepped gate insulating layer structure 460.

These goals are achieved because, a depletion region is formed between a drift region 210 and a bulk region DPW 205, being formed when a semiconductor device normally operates and the depletion layer is prevented from being formed by a current flow. In FIG. 6, when an insulating layer of a trench structure that is identical with an STI structure 395 that overlaps with a gate electrode 370 as illustrated in FIG. 4 is formed on a substrate instead of a thick gate insulating layer 462, a space where current can flow can become smaller. This effect is achieved because current flow is prevented from occurring due to a narrowed accumulation region ACC of a drift region due to STI structure below a gate electrode 470, because a depletion layer expands in an STI structure from a drift region in an EDMOS semiconductor device. In order to prevent this issue from occurring, an accumulation region ACC is to be obscured across a greater width in an EDMOS device with a STI structure that overlaps with a gate electrode 470. Thus, normal operation is possible but $R_{on}$ resistance increases as a drift region is lengthened.

On the other hand, in a stepped oxide structure, length of an accumulation region and RON region can be smaller by over 50% compared to a STI structure since space where current is able flow towards substrate surface is obtained because STI structure that overlaps with a gate electrode expands without a depletion layer. Thus, effects of a reduction of the pitch size of a unit device and reduction of a $R_{on}$ resistance of a drift region are to be expected. Then, a gate electrode $Q_g$ can be reduced to about 60% of the size of the gate electrode in an identical device pitch. Thus, a gate electrode $Q_g$ takes on a value under 10 nC and $R_{on}$ takes on a value under 10 mohm when a stepped oxide layer is formed under a gate electrode. Thus, the FOM value, which is a $R_{on}*Q_g$ value, potentially goes under 100 mohm-nC. In some examples, the FOM value falls under 60 mohm-nC. In examples, the gate charge $Q_g$ is proportional to the accumulation region length.

A gate charge includes all capacitance values generated between gate region and drain region or gate region and source region or gate region and bulk region. Among these capacitance values, it is desirable to reduce gate capacitance value between the gate region and the drain region. When a structure suggested by the present examples is used, capacitance between the gate and drain region is potentially substantially reduced. An object of using an EDMOS device with low gate charge, that is, Low $Q_g$, is to reduce power loss. Power loss due to $Q_g$ is usually generated in high frequency operation. For example, power loss due to $Q_g$ rapidly increases at over approximately 500 kHz. However, such a rapid increase of power loss is potentially prevented by arranging a thick second gate insulating layer instead of a STI structure to overlap with a gate electrode.

A semiconductor device with such a low $Q_g$ is applicable to a high frequency application such as a gate drive IC used on mobile MIC DC-DC converter or a motor drive gate driven IC. Moreover, a semiconductor device with such a stepped gate insulating layer is also potentially used on a RF device or switching power MOSFET device.

Figure 7:
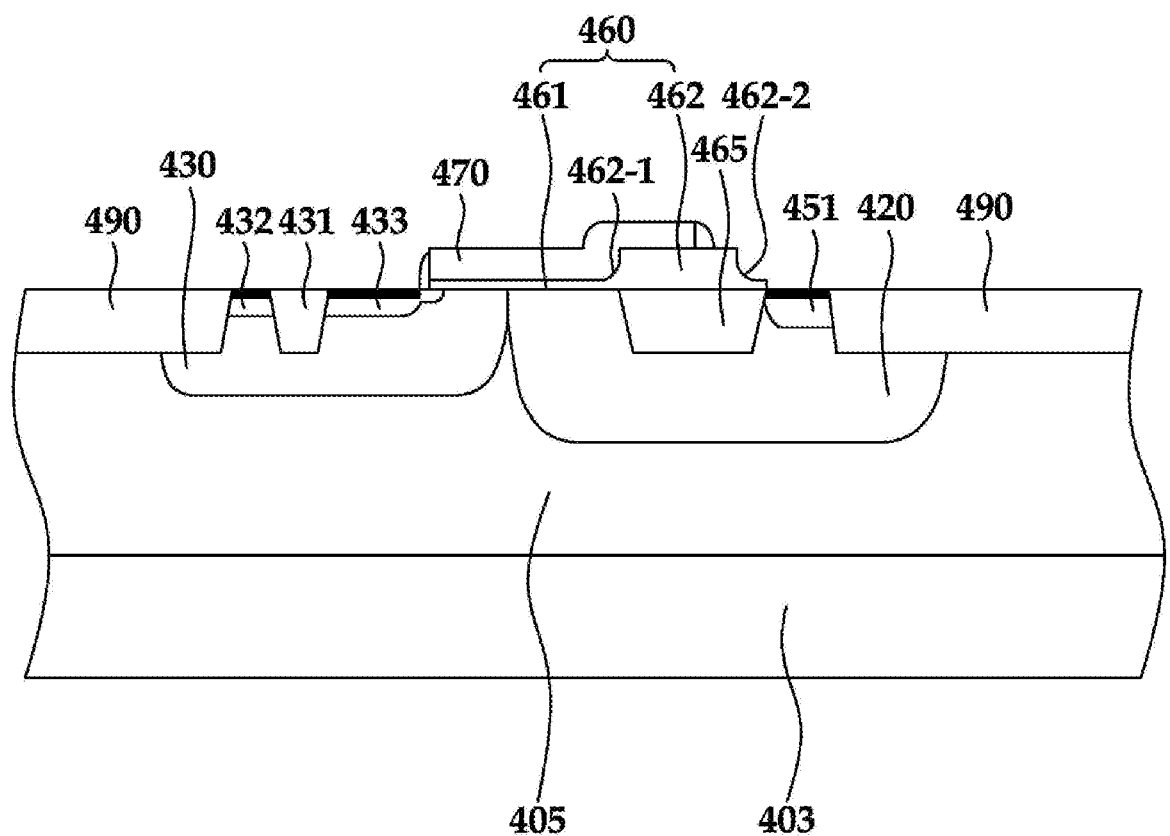
FIG. 7 is a cross-sectional diagram illustrating an EDMOS semiconductor device according to another example.

FIG. 7 is a cross-sectional diagram illustrating an EDMOS semiconductor device according to another example. FIG. 7 is different from FIG. 6 in that an insulating layer 465 of a trench type is additionally formed in a region below the Thick GOX 462 region. As previously mentioned, there is a possible disadvantage of a lengthened current route when an insulating layer 465 of a trench shape is formed. Nevertheless, insertion of not only a Thick GOX 462 but a trench type insulating layer is help since such an approach is suitable for a device requiring a higher breakdown voltage. Moreover, Thick GOX thickness can be further reduced than Thick GOX 462 of FIG. 6 of such an example. Hence, there is a potential advantage in patterning when thickness is reduced. Explanation of other structures is omitted since other possible structures are similar to those discussed with respect to FIG. 6.

Figure 8:
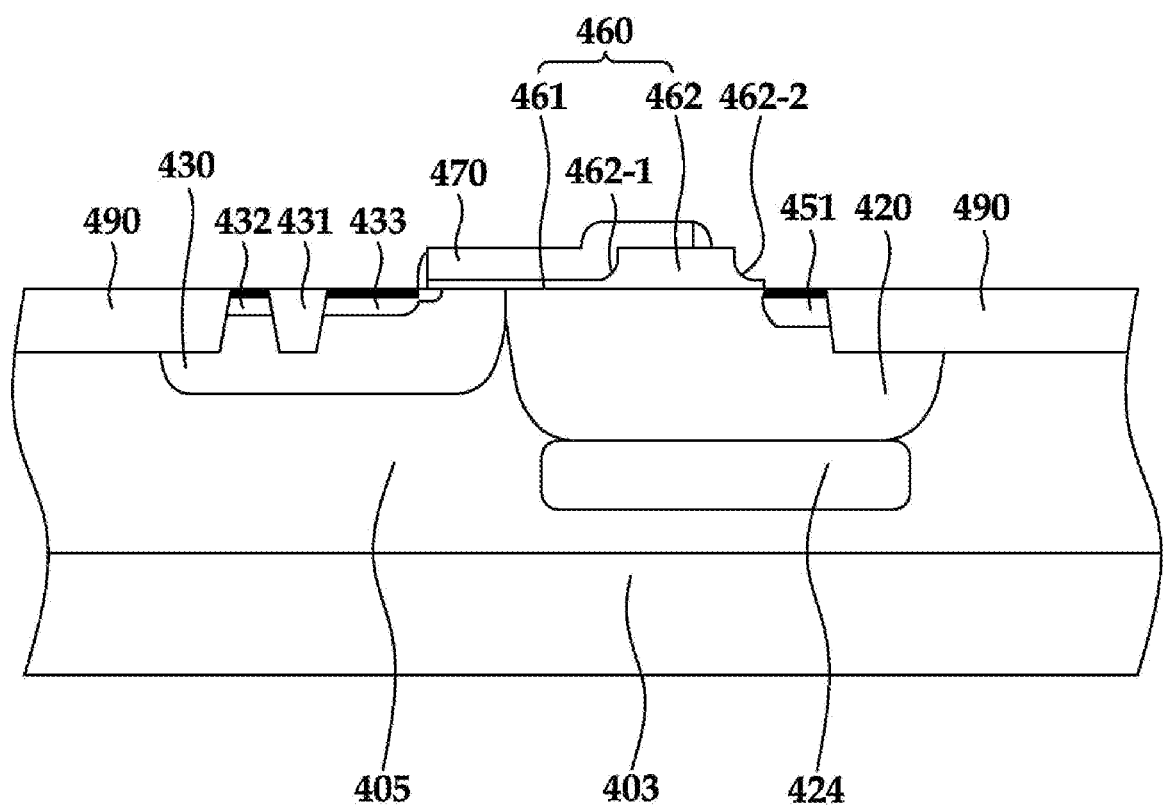
FIG. 8 is a cross-sectional diagram illustrating an EDMOS semiconductor device according to another example.

FIG. 8 is a cross-sectional diagram illustrating an EDMOS semiconductor device according to an example. FIG. 8 is different from FIG. 7 in that a P type buried layer, hereinafter referred to as PBL layer 424, is added. Thus, a breakdown voltage potentially increases since a depletion region extends to the N-DRIFT region surface, as PBL layer 424 is added. Moreover, electric current leakage into a DPW region 405 is reduced and more electric current can flow from an N-DRIFT region 420. A concentration of PBL layer 424 is determined to be higher than that of the DPW region 405. Explanation of other structures is omitted since the other structures are similar to FIG. 6.

Figure 9:
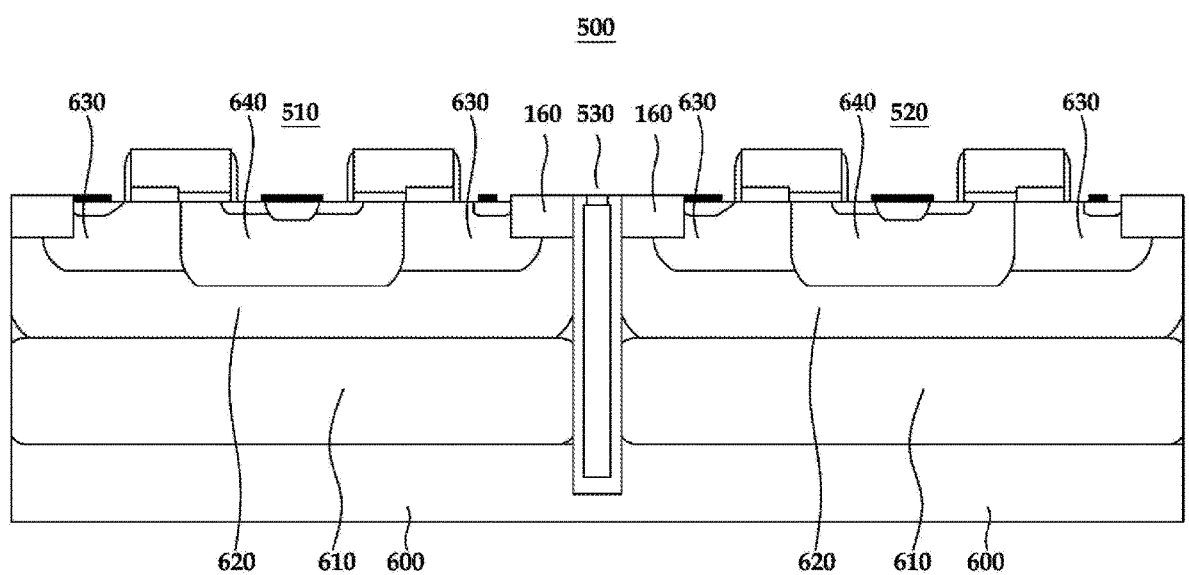
FIG. 9 is a cross sectional diagram illustrating a plurality of LDMOS semiconductor devices arranged in a horizontal direction according to an example.

FIG. 9 is a cross-sectional diagram illustrating a LDMOS semiconductor device that is arranged in a horizontal direction according to an example.

Referring to the example of FIG. 9, an N type LDMOS semiconductor device 510 and a P type LDMOS semiconductor device 520 are arranged in a horizontal direction and a deep trench 530 structure is formed between semiconductor devices 510 and 520 for separation of these devices. A trench 530 structure is formed to be deeper than a buried layer 610 on a semiconductor substrate surface and deep trench isolation process is applied. Regions such as shallow trench isolation (STI) 160 region or medium trench isolation (MTI) 160 are formed to have a smaller thickness than a depth of DTI on each side of DTI. As illustrated in FIG. 9, separation of devices is potentially easier in high voltage scenarios in which STIs or MTIs 160 are arranged on each side of DTI 530 than when there is only DTI 530. DTI 530 is potentially formed simultaneously with STI or MTI 160 and an insulating layer and a poly silicon layer are formed in a combined shape in DTI 530. First, an insulating layer is formed on side of DTI 530 and poly silicon can be formed on the insulating layer.

Likewise, the present examples potentially minimize resistance of a drift region by satisfying $BV_{dss}$ since a trench insulating layer such as the STI is replaced with a thick gate insulating layer on a substrate. Also, there is an effect of improvement in $R_{sp}$. Moreover, an accumulation region length is reduced to approximately 50% with compared to alternative STI structures according to a change from STI to a stepped oxide layer structure. Then, a high frequency application of examples is possible since a gate charge $Q_g$ is reduced to 60% with respect to an identical device pitch.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation, Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device comprising:
   a first deep well region and a second deep well region abutting against each other and disposed in a semiconductor substrate;
   a first conductivity type well region disposed in the first deep well region;
   a second conductivity type well region disposed in the second deep well region and spaced apart from the first conductivity type well region;
   a second conductivity type source region disposed in the first conductivity type well region;
   a second conductivity type drain region disposed in the second conductivity type well region;
   a second conductivity type buried layer in direct contact with and located below the first deep well region and the second deep well region;
   a gate insulating layer formed on the first deep well region and the second deep well region;
   a gate electrode disposed on the gate insulating layer;
   first and second spacers disposed on sidewalls of the gate electrode;
   a first deep trench isolation disposed to abut the first deep well region and the second conductivity type buried layer, and spaced apart from the first conductivity type well region formed in the first deep well region; and
   a second deep trench isolation disposed to abut the second deep well region and the second conductivity type buried layer, and spaced apart from the second conductivity type well region formed in the second deep well region,
   wherein the second deep well region is in direct contact with the second deep trench isolation, the second conductivity type buried layer, the second conductivity type well region and the gate insulating layer.

2. The semiconductor device of claim 1, wherein the first deep trench isolation and the second deep trench isolation are formed to surround the first conductivity type well region, the second conductivity type well region, the first deep well region, the second deep well region, and the second conductivity type buried layer, respectively.

3. The semiconductor device of claim 1, further comprising:
   a first shallow trench isolation formed in the first deep well region; and
   a second shallow trench isolation formed in the second deep well region,
   wherein the first shallow trench isolation is in contact with the first conductivity type well region,
   wherein a depth of the second conductivity type well region is shallower than the second deep well region but deeper than each of the first and second shallow trench isolations, and
   wherein the second shallow trench isolation is in contact with the second conductivity type well region and the second conductivity type drain region.

4. The semiconductor device of claim 1, wherein the first deep trench isolation and the second deep trench isolation are in contact with the second conductivity type buried layer and are formed deeper than the second conductivity type buried layer.

5. The semiconductor device of claim 1, wherein the gate insulating layer comprises a first gate insulating layer having a first thickness and a second gate insulating layer having a second thickness that is thicker than the first gate insulating layer.

6. The semiconductor device of claim 5, wherein the second gate insulating layer is disposed between the drain region and the first gate insulating layer disposed adjacent to the source region.

7. The semiconductor device of claim 5, wherein the second gate insulating layer is disposed spaced apart from the second conductivity type well region.

8. The semiconductor device of claim 2, wherein the second deep well region extends from a region below the second shallow trench isolation to a region below the gate insulating layer.

9. The semiconductor device of claim 5, wherein the first gate insulating layer overlaps with the first deep well region and the second deep well region.

10. The semiconductor device of claim 1, wherein the edge of the second conductivity type drain region is horizontally spaced apart from each edge of the second conductivity type well region and the second deep well region.

11. The semiconductor device of claim 1, wherein the first deep well region in which the first conductivity type well region is formed is in direct contact with the first deep trench isolation, the second conductivity type buried layer, the first conductivity type well region and the gate insulating layer.

12. The semiconductor device of claim 1, wherein the first conductivity type well region formed in the first deep well region overlaps the gate electrode and the first spacer,
wherein the second conductivity type well region formed in the second deep well region is spaced apart from the gate insulating layer and the second spacer, and
wherein an edge of the second conductivity type drain region is spaced apart from an edge of the second conductivity type well region formed in the second deep well region.

13. The semiconductor device of claim 1, wherein the first conductivity type well region formed in the first deep well region has a horizontal maximum length greater than that of the second conductivity type well region formed in the second deep well region.

14. The semiconductor device of claim 1, wherein the first conductivity type well region formed in the first deep well region is in direct contact with the second conductivity type source region and a first conductivity type pickup region.

15. A semiconductor device comprising:
a first deep well region and a second deep well region abutting against each other and disposed in a semiconductor substrate;
a first conductivity type well region disposed in the first deep well region;
a second conductivity type well region disposed in the second deep well region and spaced apart from the first conductivity type well region;
a second conductivity type source region disposed in the first conductivity type well region;
a second conductivity type drain region disposed in the second conductivity type well region;
a second conductivity type buried layer in direct contact with and located below the first deep well region and the second deep well region;
a gate insulating layer formed on the first deep well region and the second deep well region, and spaced apart from the second conductivity type well region;
a gate electrode disposed on the gate insulating layer;
a first deep trench isolation disposed to abut the first deep well region and the second conductivity type buried layer, and spaced apart from the first conductivity type well region formed in the first deep well region; and
a second deep trench isolation disposed to abut the second deep well region and the second conductivity type buried layer, and spaced apart from the second conductivity type well region formed in the second deep well region,
wherein the first deep well region is in direct contact with the first deep trench isolation, the second conductivity type buried layer, the first conductivity type well region and the gate insulating layer.

16. The semiconductor device of claim 15, further comprising:
a first shallow trench isolation formed in the first deep well region;
a second shallow trench isolation formed in the second deep well region;
a third shallow trench isolation separating the second conductivity type source region and a first conductivity type pickup region disposed in the first conductivity type well region; and
a fourth shallow trench isolation overlapped with the gate electrode and separating the gate electrode and the second conductivity type drain region,
wherein a depth of the second conductivity type well region is shallower than the second deep well region but deeper than each shallow trench isolation,
wherein the first conductivity type well region encloses the first conductivity type pickup region, the second conductivity type source region and the third shallow trench isolation, and
wherein the second conductivity type well region is in contact with the second shallow trench isolation and the fourth shallow trench isolation.

17. The semiconductor device of claim 15, wherein the first deep trench isolation and the second deep trench isolation are in contact with the second conductivity type buried layer and are formed deeper than the second conductivity type buried layer.

18. The semiconductor device of claim 15,
wherein the second deep well region in which the second conductivity type well region is formed is in direct contact with the second deep trench isolation, the second conductivity type buried layer, the second conductivity type well region and the gate insulating layer.

19. The semiconductor device of claim 15, wherein a depth of the first deep trench isolation is greater than a total depth of the first deep well region and the second conductivity type buried layer.

20. The semiconductor device of claim 15, wherein the first deep trench isolation and the second deep trench isolation are disposed to surround the first conductivity type well region, the second conductivity type well region, the first deep well region, the second deep well region and the second conductivity type buried layer.

* * * * *